United States Patent
Ware et al.

(10) Patent No.: US 11,347,441 B2
(45) Date of Patent: *May 31, 2022

(54) MEMORY COMPONENT HAVING INTERNAL READ-MODIFY-WRITE OPERATION

(71) Applicant: Rambus Inc., San Jose, CA (US)

(72) Inventors: Frederick A. Ware, Los Altos Hills, CA (US); Thomas Vogelsang, Mountain View, CA (US)

(73) Assignee: Rambus Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/247,167

(22) Filed: Dec. 2, 2020

(65) Prior Publication Data
US 2021/0089237 A1    Mar. 25, 2021

Related U.S. Application Data

(63) Continuation of application No. 16/371,345, filed on Apr. 1, 2019, now Pat. No. 10,860,253, which is a
(Continued)

(51) Int. Cl.
*G06F 3/06* (2006.01)
*G11C 7/10* (2006.01)
(Continued)

(52) U.S. Cl.
CPC .......... *G06F 3/0659* (2013.01); *G06F 3/0604* (2013.01); *G06F 3/0619* (2013.01);
(Continued)

(58) Field of Classification Search
CPC .. G06F 3/0659; G06F 3/0673; G06F 11/1076; G06F 3/0604; G06F 3/0619;
(Continued)

(56) References Cited

U.S. PATENT DOCUMENTS 5,535,406 A    7/1996   Kolchinsky
6,141,272 A    10/2000  Van de Graaff et al.
(Continued)

OTHER PUBLICATIONS

Ting-Lu Huang, "Fast and fair mutual exclusion for shared memory systems," Proceedings. 19th IEEE International Conference on Distributed Computing Systems (Cat. No. 99CB37003), Austin, TX, USA, 1999, pp. 224-231. (Year: 1999).*
(Continued)

*Primary Examiner* — Cynthia Britt
(74) *Attorney, Agent, or Firm* — Lowenstein Sandler LLP

(57) ABSTRACT

An memory component includes a memory bank and a command interface to receive a read-modify-write command, having an associated read address indicating a location in the memory bank and to either access read data from the location in the memory bank indicated by the read address after an adjustable delay period transpires from a time at which the read-modify-write command was received or to overlap multiple read-modify-write commands. The memory component further includes a data interface to receive write data associated with the read-modify-write command and an error correction circuit to merge the received write data with the read data to form a merged data and write the merged data to the location in the memory bank indicated by the read address.

20 Claims, 9 Drawing Sheets

Related U.S. Application Data continuation of application No. 15/990,211, filed on May 25, 2018, now Pat. No. 10,248,358, which is a continuation of application No. 15/022,176, filed as application No. PCT/US2014/057040 on Sep. 23, 2014, now Pat. No. 9,983,830.

(60) Provisional application No. 61/881,869, filed on Sep. 24, 2013.

(51) Int. Cl.
  *G11C 29/02* (2006.01)
  *G06F 11/10* (2006.01)
  *G11C 29/04* (2006.01)

(52) U.S. Cl.
  CPC .......... *G06F 3/0638* (2013.01); *G06F 3/0673* (2013.01); *G06F 11/1076* (2013.01); *G11C 7/1006* (2013.01); *G11C 7/1009* (2013.01); *G11C 7/109* (2013.01); *G11C 7/1087* (2013.01); *G11C 7/1093* (2013.01); *G11C 29/023* (2013.01); *G11C 29/028* (2013.01); *G11C 2029/0411* (2013.01); *G11C 2207/107* (2013.01)

(58) Field of Classification Search
  CPC ... G06F 3/0638; G11C 29/028; G11C 29/023; G11C 7/1093; G11C 7/1006; G11C 7/1087; G11C 7/109; G11C 7/1009; G11C 2029/0411; G11C 2207/107
  See application file for complete search history.

(56) References Cited

U.S. PATENT DOCUMENTS

| | | |
|---|---|---|
| 6,546,476 B1 | 4/2003 | Gillingham |
| 7,475,271 B2 | 1/2009 | Oner |
| 7,505,356 B2 | 3/2009 | Ware et al. |
| 7,908,443 B2 | 3/2011 | Hillier, III et al. |
| 8,050,134 B2 | 11/2011 | Ware et al. |
| 8,397,129 B2 | 3/2013 | Schreck et al. |
| 8,909,860 B2 * | 12/2014 | Rao ..................... G06F 11/1012 711/114 |
| 9,983,830 B2 | 5/2018 | Ware et al. |
| 10,248,358 B2 * | 4/2019 | Ware ..................... G11C 29/023 |
| 2002/0015344 A1 | 2/2002 | Leung et al. |
| 2005/0273564 A1 | 12/2005 | Lakshmanamurthy et al. |
| 2006/0080589 A1 | 4/2006 | Holm et al. |
| 2006/0123322 A1 | 6/2006 | Leung et al. |
| 2009/0276587 A1 | 11/2009 | Moyer et al. |
| 2010/0290150 A1 | 11/2010 | Sumi et al. |
| 2010/0306623 A1 | 12/2010 | Hsueh et al. |
| 2011/0191655 A1 | 8/2011 | Schreck et al. |
| 2013/0194879 A1 | 8/2013 | Perego et al. |
| 2013/0246750 A1 | 9/2013 | Moyer et al. |
| 2014/0344653 A1 | 11/2014 | Flinsbaugh et al. |

OTHER PUBLICATIONS

CN Office Action With dated Oct. 12, 18 re: CN Appln. No. 201480042800.8. 7 Pages (With Translation).

CN Office Action with dated Feb. 5, 2018 re: CN Appln. No. 201480042800.8. 13 Pages. (W/Translation).

Liu, Lei et al., "An Efficient LDPC Encoder Based on Block-Column Cycle Structure for CMMB", 2013 IEEE 4th International Conference on Software Engineering and Service Science, Beijing, 2013, pp. 511-514 (Year: 2013). 4 pages.

Noguchi, Hiroki et al., "4Mb STT-MRAM-Based Cache with Memory-Access-Aware Power Optimization and Write-Verify-Write / Read-Modify-Write Scheme", 2016 IEEE International Solid-State Circuits Conference (ISSCC), Session 7/ Nonvolatile Memory Solutions/ 7.2, San Francisco, CA, 2016, pp. 132-133. 3 Pages.

Notification Concerning Transmittal of International Preliminary Report on Patentability dated Apr. 7, 2016 re Int'l. Appln. No. PCT/US14/057040. 12 Pages.

PCT International Search Report and Written Opinion dated Dec. 29, 2014 in International Application No. PCT/US2014/057040. 13 pages.

Y.-H. Park, et al., "Bit-wise read-compare-write scheme for low power read-modify-write DRAM operation", Electronics Letters, vol. 38, No. 2, pp. 62-63, Jan. 17, 2002. 2 Pages.

* cited by examiner

MEMORY COMPONENT HAVING INTERNAL READ-MODIFY-WRITE OPERATION

RELATED APPLICATIONS

This application is a continuation of U.S. application Ser. No. 16/371,345, filed Apr. 1, 2019, now U.S. Pat. No. 10,860,253, issued Dec. 8, 2020, which is a continuation of U.S. application Ser. No. 15/990,211, filed May 25, 2018, now U.S. Pat. No. 10,248,358, issued Apr. 2, 2019, which is U.S. application Ser. No. 15/022,176, filed Mar. 15, 2016, now U.S. Pat. No. 9,983,830, issued May 29, 2018, which is a 371 application of PCT/US2014/057040 filed Sep. 23, 2014, which claims the benefit of U.S. Provisional Application No. 61/881,869, filed Sep. 24, 2013, the entire contents of which are hereby incorporated by reference herein.

BRIEF DESCRIPTION OF THE DRAWINGS

The present disclosure is illustrated by way of example, and not by way of limitation, in the figures of the accompanying drawings.

DETAILED DESCRIPTION

Figure 1:
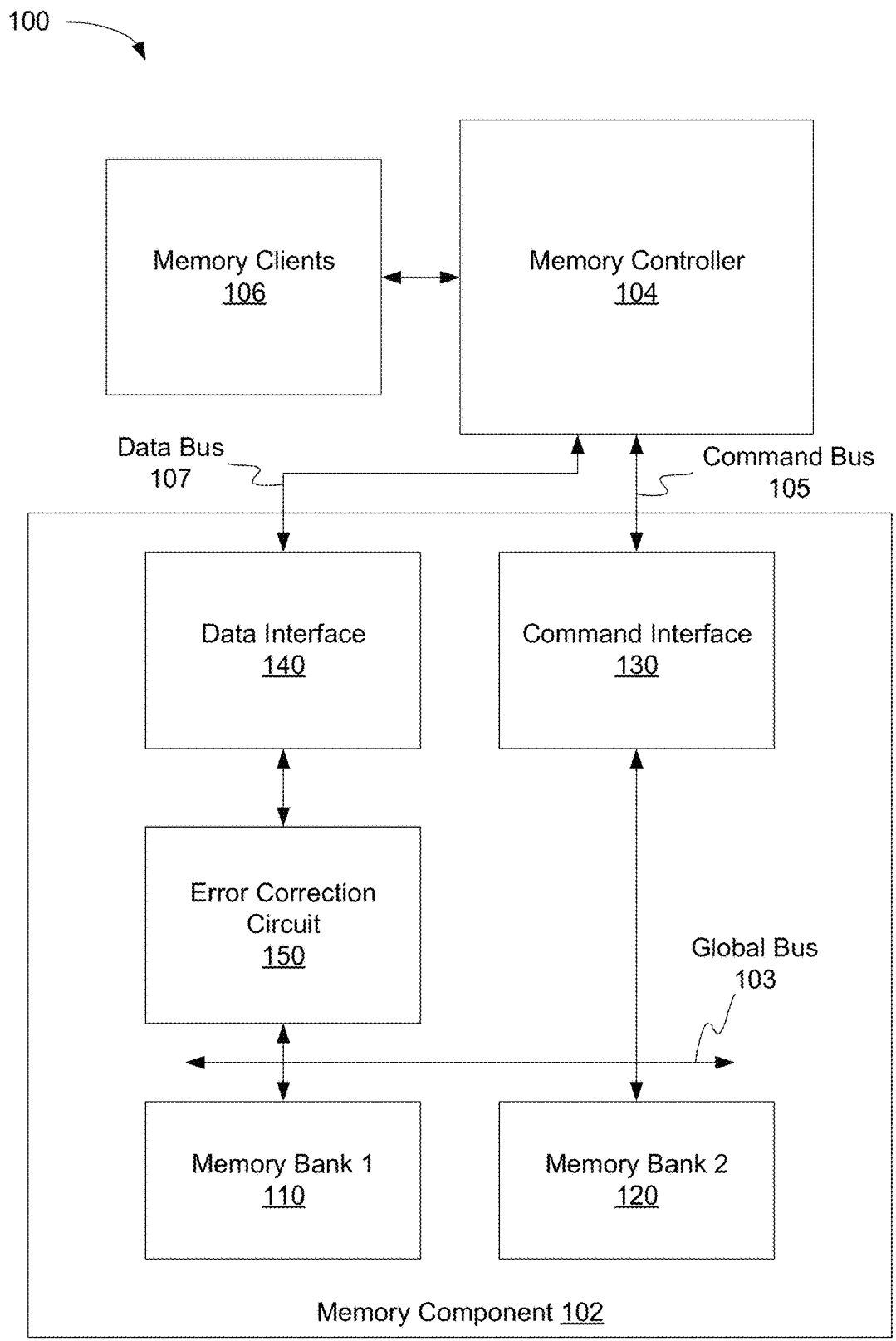
FIG. 1 is a block diagram illustrating a computing system including a memory component with internal read-modify-write operation, according to an embodiment.

Embodiments are described for read-modify-write operations for a memory component. In the embodiments described, read-modify-write operations are component internal memory operations that both atomically read a memory location and write a new value into the memory location during the same operation. The new value written to the memory location may be a completely new value (e.g., received from a memory controller) or may be some function of the previous value read from the memory location. Read-modify-write operations can be used to prevent race conditions in multi-threaded applications and can be used in non-blocking synchronization, among other uses.

In one embodiment, a memory component (e.g., a dynamic random access memory (DRAM)) includes one or more banks of memory cells. Each bank may include a number of memory cells where memory client data may be stored. Each cell in the memory banks may be identified by a memory address. A memory controller component external to the memory component may send commands to the memory component on behalf of the memory clients. These commands may include, for example, read-modify-write commands. In one embodiment, a "component," as used herein, refers to a circuit or device embodied on a single chip or die. In other embodiments, individual components may be stacked or encapsulated with other die, however, each component is itself a single die.

In one embodiment, the memory component includes two or more bi-directional data buses. A global bus (G) may be used to transfer data internal to the memory component, such as between a data interface and the one or more memory banks. A data bus (DQ) may be used to transmit data from the memory component, such as between the data interface of the memory component and the memory controller. When performing a read-modify-write operation in the memory component, both the global bus and the data bus are used in opposing directions depending if data is being written to or read from the memory banks in the memory component. This can result in an interference of the read and write signals, which may be referred to as blocking. In order to avoid blocking, the directions of data flow for both the global and data bus are alternated depending on the current phase of the read-modify-write operation. There is, however, a turnaround time associated with changing the direction of these buses which can negatively affect performance of the memory component. The performance may be decreased further if internal error correction is performed as part of the read-modify-write operation.

In order to decrease or avoid the negative effects on memory component performance, in one embodiment, the memory component may perform an internal read-modify-write operation that includes at least one of a delayed read access portion of the read-modify-write operation, an overlap in time of the read data decode and write data encode, an overlap of two or more read-modify-write operations where the write access of a first read-modify-write operation occurs after the read access of a second read-modify-write operation, or a first read-modify-write operation being dedicated to a first memory bank in the memory component while a second read-modify-write operation being dedicated to a second memory bank in the memory component. In one embodiment, the memory component may include an internal error detection and correction block that operates along with byte-maskable write operations to perform read-modify-write operations, as described herein. Each of these techniques, even when used in combination with internal error detection and correction, may result in improved read-modify-write performance. For example, depending on the embodiment, the read-modify-write bandwidth may improve from approximately ⅙ of the peak bandwidth to ⅕, ¼, 2/7, or ⅜ of the peak bandwidth. This represents a significant improvement in the time utilized to perform a read-modify-write operation in the memory component.

FIG. 1 is a block diagram illustrating a computing system 100 including a memory component 102 having internal read-modify-write operation, according to an embodiment. Computing device 100 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single computing device is illustrated, the term "computing device" shall also be taken to include any collection of machines that individually or jointly execute a set (or multiple sets) of instructions to perform any one or more of the methodologies discussed herein. In one embodiment, computing system 100 includes memory component 102, memory controller 104, and one or more memory clients 106.

Memory controller 104 can manage the flow of data going to and from memory component 102. For example, memory controller 104 can receive and process memory access requests from the one or more memory clients 106 in computing device 100. In addition, memory controller 104 can retrieve requested data from memory component 102 and provide the data to a requesting memory client 106. In one embodiment, memory controller 104 may have an internal queue that accepts memory access requests from requestors, such as memory clients 106. The requests may include, for example, reads, writes, read-modify-writes or other memory operations. In one embodiment, write requests and read-modify-write requests are held in the internal queue, while read requests are passed through to memory component 102 upon receipt. When the internal queue reaches a certain size (e.g., a threshold), memory controller 104 may issue the writes and read-modify-writes to memory component 102 in a burst. Depending on the number of read-modify-writes in the burst, memory controller 104 may instruct memory component 102 to use either the delayed read access or the overlapping read-modify-write technique in order to optimize performance. In one embodiment, memory controller 104 may be part of another component, such as a processing device. In other embodiments, however, memory controller 104 can be a separate chip or integrated into a different chip within computing device 100. For example, in another embodiment, the CPU and GPU cores of a processing device can be connected to one other and to an internal processor cache and memory controller 104 may be connected externally to the processing device. In other embodiments, memory controller 104 and memory clients 106 can be connected in some other fashion. A System-on-Chip (SoC) containing the memory controller 104 will often be referred to as the "Controller Component", "DRAM Controller", or "memory controller".

Memory component 102 may include a memory array, such as flash memory, dynamic random access memory (DRAM) (e.g., synchronous DRAM (SDRAM) or Rambus DRAM (RDRAM), etc.), or a static memory, such as static random access memory (SRAM), etc. Memory banks 110 and 120 may each include a number of memory cells or locations where data values may be stored. Each cell or collection of cells in the memory banks 110 and 120 may be identified by a memory address. Thus, when a command address signal (e.g., received as part of a read-modify-write request) is received by memory component 102, a command interface 130 can identify the corresponding location or cell in the memory banks 110 and 120. In embodiments, command and address receivers may be separate busses or may be multiplexed together in a single request interface.

In one embodiment, memory component 102 includes memory banks 110 and 120, command interface 130, data interface 140, and error correction circuit 150. Memory banks 110 and 120 may be connected to other blocks in memory component 102, such as command interface 130, data interface 140, and error correction circuit 150 by global bus 103. Command interface 130 and data interface 140 in memory component 102 may be connected to memory controller 104 by command bus 105 and data bus 107, respectively. In one embodiment, the memory controller 104 and the memory component 102 communicate with each other across a high-speed Very Low Swing-Near Ground (VLS-NG) signaling interface. VLS-NG signaling operates in one design at speeds of up to 2 Gbps, using very low voltage swings in order to minimize power. A reference clock (CK) and command-address (CA) 105 and data (DQ) 107 lanes may all utilize the VLS-NG technology, while standard rail-to-rail CMOS signaling may be used for chip enable (EN) lanes.

In one embodiment, the CA lanes 105 are utilized to deliver commands and addresses from the memory controller 104 to the memory component 102, while the DQ lanes 107 carry read and write data between the two. The number of CA and DQ lanes used to communicate between the memory controller 104 and the memory component 102 are scalable parameters of the interface architecture. The number of CA and DQ lanes implemented may be dependent upon the quantity and width of the memory component 102 and the required CA and DQ bandwidth. In one embodiment, the memory controller 104 is sized to support the appropriate number of CA and DQ lanes for each system. In one embodiment, all CA and DQ data transfers may be synchronous, meaning that they are referenced to CK transitions.

Figure 2:
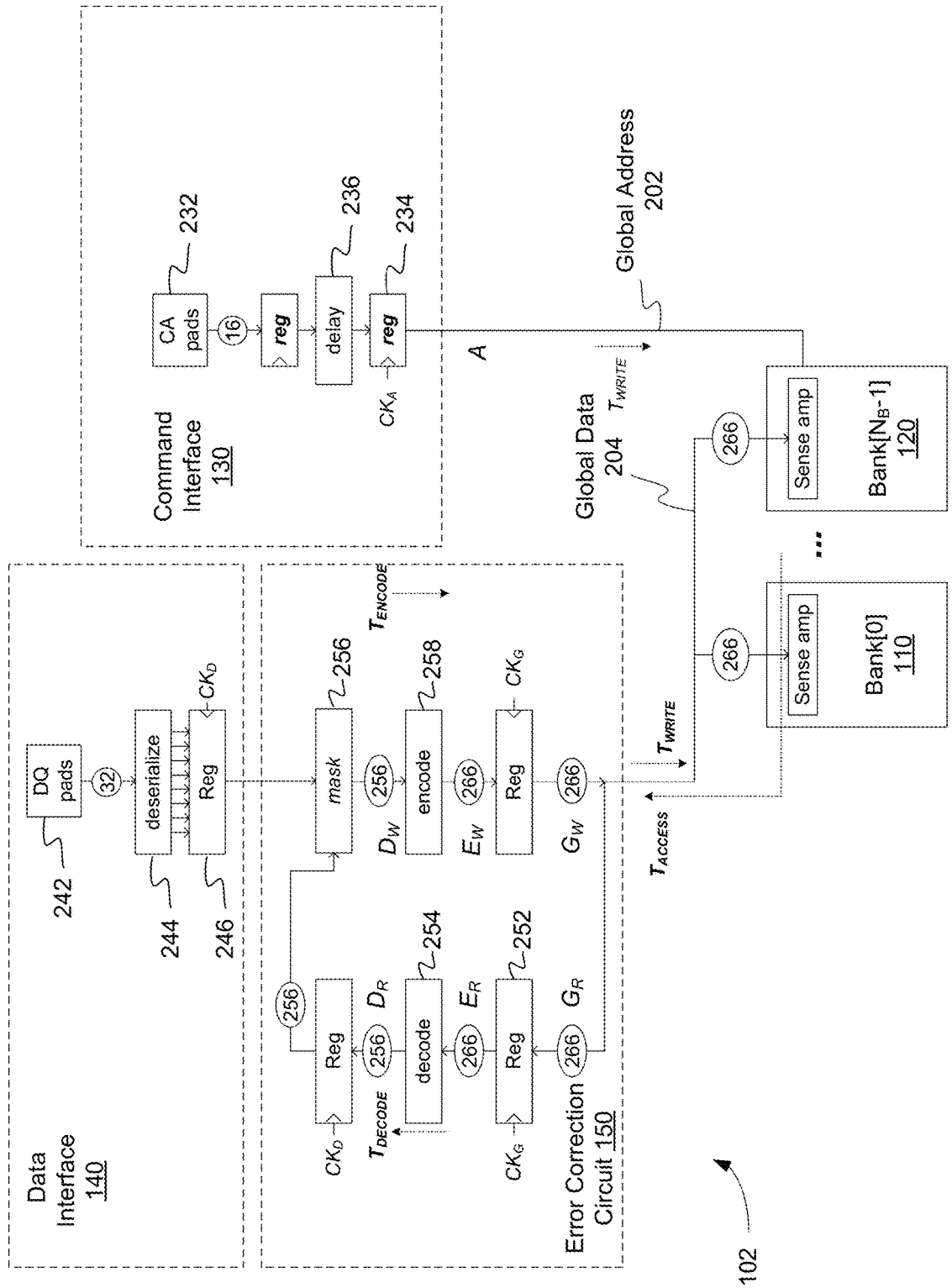
FIG. 2 is a block diagram illustrating a memory component with internal read-modify-write operation, according to an embodiment.

FIG. 2 is a block diagram illustrating a memory component 102 for read-modify-write operation, according to an embodiment. As described above, in one embodiment, memory component 102 includes memory banks 110 and 120, command interface 130, data interface 140 and error correction circuit 150. In this embodiment, global bus 103 has been shown as two separate buses, including global address bus 202 and global data bus 204. Global address bus 202 passes address information between command interface 130 and memory banks 110 and 120, while global data bus 204 passes read and write data between data interface 140, error correction circuit 150 and memory banks 110 and 120. In practice, global bus 103 may include more or fewer busses, depending on the embodiment. The illustrated embodiment shows two memory banks 110 and 120. In other embodiments, however, memory component 102 may include some other number of memory banks.

In one embodiment, a read-modify-write command is received at command interface 130. The read-modify-write command may be received at command address (CA) pads 232 from memory controller 104 over command bus 105. In one embodiment, the read-modify-write command includes a 16 bit value. In other embodiments, however, the read-modify-write command may include a value of some other size. Based on the clock signal (CK) the 16 bit value may be stored in a register 234. In one embodiment, the address A indicating a location in memory banks 110 and 120 is driven out on global address bus 202 to memory banks 110 and 120. A data access operation at the location specified by the address A is performed and a 266 bit data value is driven onto global data bus 204 from the memory banks 110 and 120. This value may be stored in register 252 of error correction circuit 150. In one embodiment, this value may be referred to as the "read data" associated with the read-modify-write operation.

In one embodiment, a decoder 254 decodes the 266 bit read data. The decoder 254 performs error detection and correction on the read data using a 10 bit syndrome in the read data. Depending on the embodiment, decoder 254 may use hamming error correction, single error correction/double error detection, or some other error correction technique to correct at least single bit errors in the read data. As a result of the error correction, the 10 bit syndrome is removed and decoder 254 outputs a 256 bit value. The use of a 256 bit data value and a 10 bit syndrome as described above is merely one possible implementation, according to an embodiment. In other embodiments, the data width and syndrome widths may vary according to the particular implementation.

In one embodiment, the 256 bit error corrected value is merged with a received "write data" value associated with the read-modify-write operation. The write data may be received at DQ pads 242 in data interface 140 from memory controller 104 over data bus 107. In one embodiment, the write data includes eight 32 bit words that are deserialized by deserializer 244 into a 256 bit value. In other embodiments, however, the write data may include a value or values of some other size. Based on the clock signal (CK) the 256 bit value may be stored in a register 246.

In one embodiment, the deserialized write data from register 246 is merged with the error corrected read data from decoder 254 using a data mask 256. In one embodiment, the data mask 256 is received with the write data from memory controller 104. The data mask 256 may include data used for operations to signify which bits or bytes from the write data should be overwritten with bits or bytes from the read data and which bits or bytes in the write data should remain unchanged. In one embodiment, the data mask 256 may include 32 bits transferred on four control signals in parallel with the 32 data signals, to control whether separate 8-bit data bytes are written (0) or masked (1). The result of data mask 256 is a 256 bit merged data value. In one embodiment, encoder 258 encodes the merged data by generating a ten bit syndrome and adding (e.g., appending) the syndrome to the merged data to create a 266 bit value. Error correction circuit 150 may drive the 266 bit value onto global data bus 204, where the value is written to memory banks 110 and 120 at the location identified by address A (i.e., the location from which the read data was read).

In one embodiment, memory component 102 uses a read-modify-write operation as is described in detail below. The read-modify-write operation may be improved in a number of ways. In general, each of the sub-operations in the read-modify-write operation described above may be timed according to a clock signal CK. The timing may be such that each sub-operation occurs during a separate column cycle interval. Depending on the system timing, one column cycle interval may include, for example, four clock cycles of the system clock, or some other value. In one embodiment, in order to improve performance of the read-modify-write operation, memory component 102 may delay the read access sub-operation by an adjustable number of column cycle intervals (e.g., one or two column cycle intervals). In another embodiment, memory component 102 may overlap two or more read-modify-write operations (e.g., two or three read-modify-write operations), such that the write access of a first read-modify-write operation occurs during a column cycle interval after the read access of a second read-modify-write operation. Additional details of the read-modify-write operations are provided below with respect to the timing diagrams in FIGS. 3-6 and the flow diagrams in FIGS. 7-8.

Figure 3:
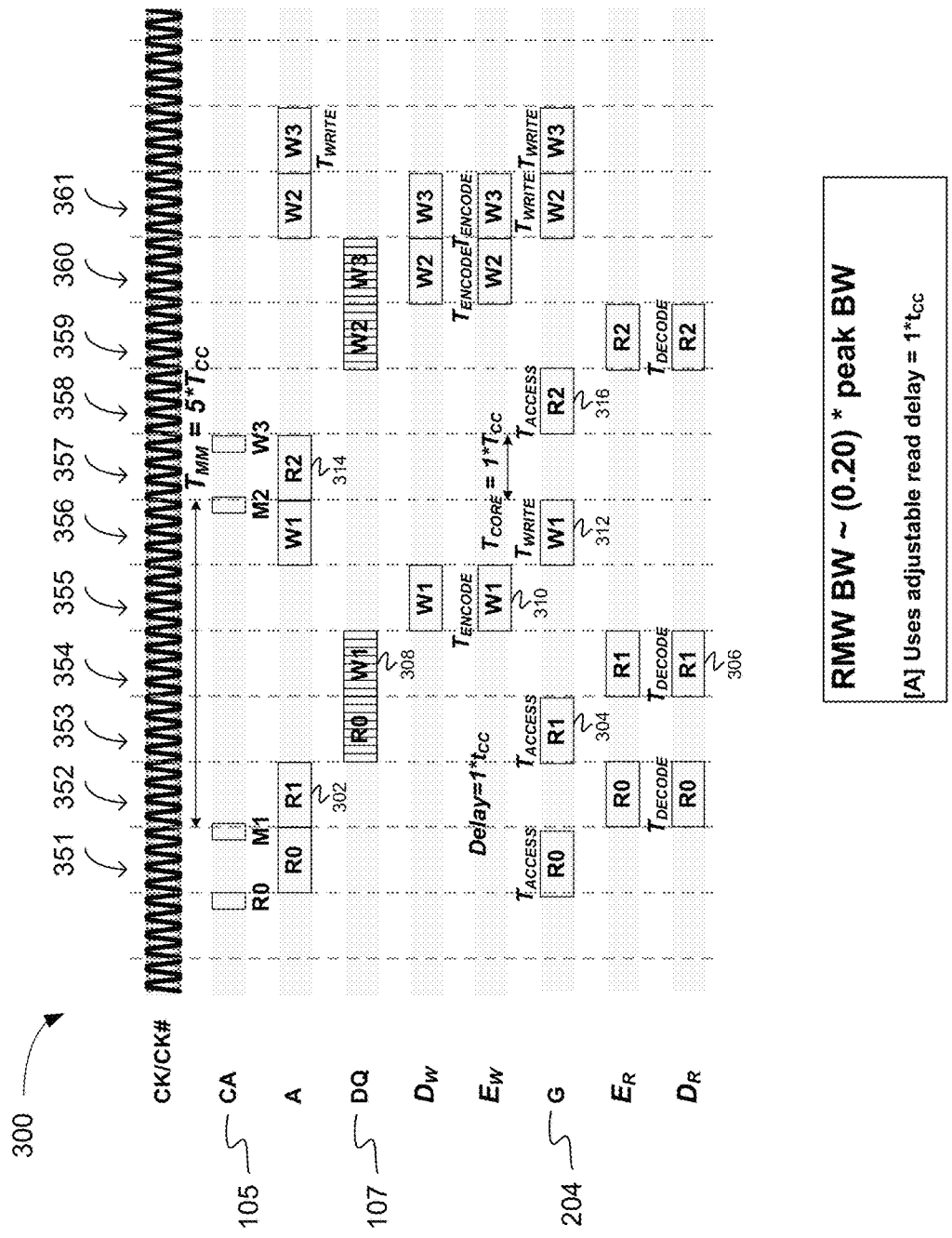
FIG. 3 is a timing diagram illustrating delayed read access for a read-modify-write operation in a memory component with a delay of one column cycle interval, according to an embodiment.

FIG. 3 is a timing diagram 300 illustrating delayed read access for a read-modify-write operation in a memory component with a delay of one column cycle interval, according to an embodiment. Timing diagram 300 illustrates a series of memory operations including a read command R0, a first read-modify-write command M1, a second read-modify-write command M2 and a write command W3. These commands may be received over the command bus (CA) 105. Timing diagram 300 illustrates the column cycle intervals 351-361 where the sub-operations of each of these memory operations occur relative to one another, according to one embodiment.

In one embodiment, the first read-modify-write command M1 is received during column cycle interval 351. At column cycle interval 352, the address (A) for the read data is identified 302. Rather than performing the read access (R1) 304 on global data bus (G) 204 during column cycle interval 351, however, the read access (R1) 304 may be delayed by one column cycle interval. In one embodiment, a delay element 236 in command interface 130 delays the read address from being provided to memory banks 110 and 120 by an adjustable number of column cycle intervals. The delay may be set by a control signal provided by memory controller 104 to delay element 236 or may be specified within the read-modify-write command itself. Thus, in one embodiment, the read access (R1) 304 on global data bus (G) 204 may occur during column cycle interval 353.

During column cycle interval 354, the read data R1 read from memory banks 110 and 120 may be decoded ($D_R$) 306 by decoder 254 in error correction circuit 150. During the same column cycle interval 354, the write data W1 308 associated with the read-modify-write command M1 may be received on the data bus (DQ) 107. During column cycle interval 355, the write data W1 may be merged with the read data R1 using data mask 256 and the merged data may be encoded ($E_W$) 310 by encoder 258 in error correction circuit 150. During column cycle interval 356, the encoded merged data is written W1 312 to memory banks 110 and 120 at the identified address (A) over global data bus (G) 204.

Once the encoded merged data is written 312 to memory banks 110 and 120, the first read-modify-write operation M1 is complete. Thus, at column cycle interval 357, the second read-modify-write operation M2 can begin. During column cycle interval 357, the address (A) for the read data R2 is identified 314. The global data bus (G) 204 also uses column cycle interval 357 to switch the direction of data flow from writing write data W1 to reading read data R2. At column cycle interval 358, the read access (R2) 316 on global data bus (G) 204 may occur. This is after a one column cycle interval delay created by delay element 236 in command interface 130. The remaining sub-operations of the second read-modify-write operation M2 may occur in column cycle intervals 359, 360, and 361 similarly to those described above with respect to the first read-modify-write operation M1.

In this embodiment, the time between the first read-modify-write operation M1 and the second read-modify-write operation M2 is five column cycle intervals. This represents an improvement of one column cycle interval over an embodiment where the read access sub-operation 304 is not delayed by at least one column cycle interval. In one embodiment, a read access sub-operation will begin as soon as the corresponding address is available. Thus, a read-modify-write operation that starts its access operation as soon as possible will use six column cycle intervals between successive read-modify-write operations. A read-modify-write operation that delays its access operation by one column cycle interval will use only five column cycles intervals between successive read-modify-write operations. Thus, delaying the read access sub-operation 304 actually decreases the total amount of time used to perform the read-modify-write operation M1.

Figure 4:
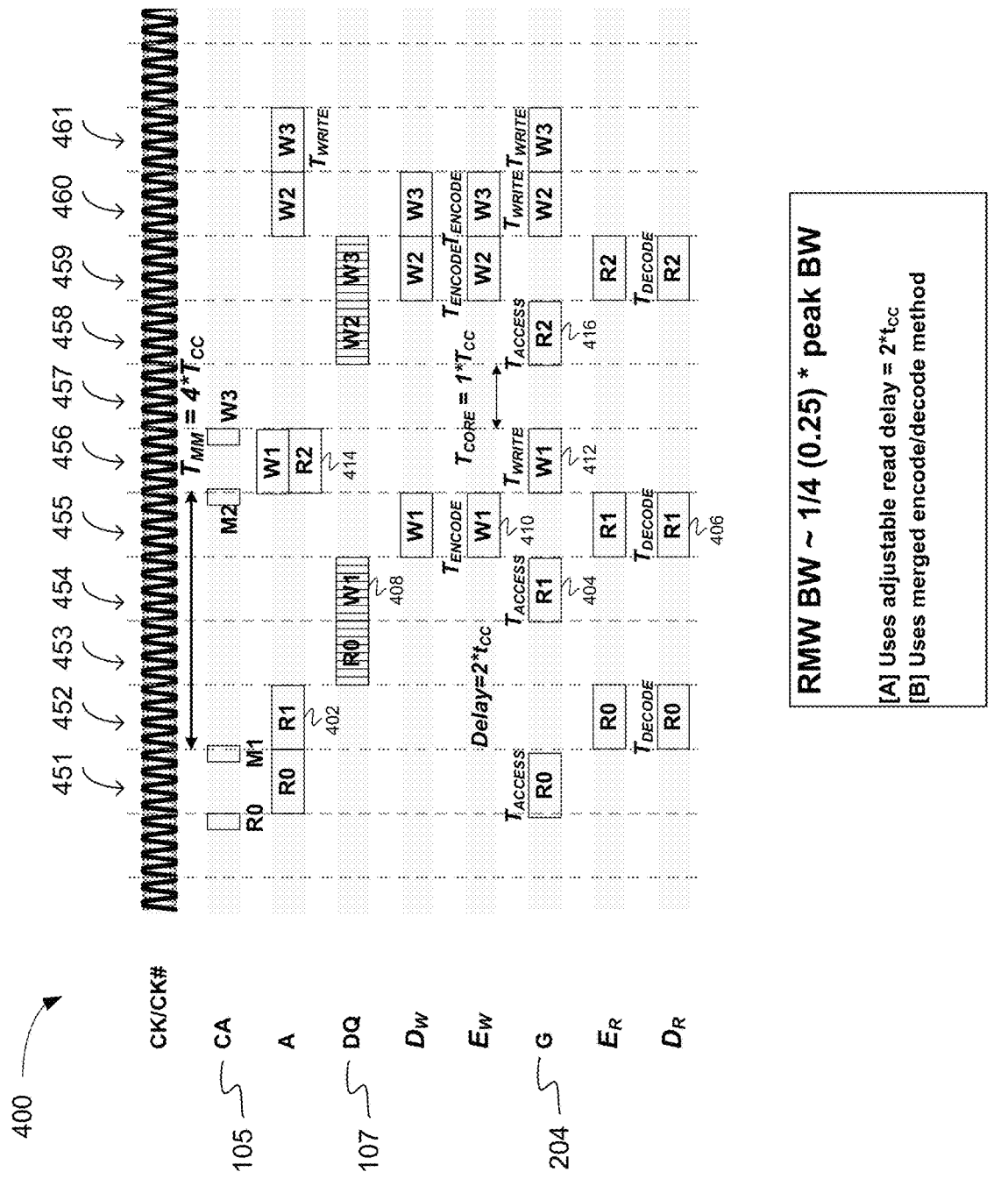
FIG. 4 is a timing diagram illustrating delayed read access for a read-modify-write operation in a memory component with a delay of two column cycle intervals, according to an embodiment.

FIG. 4 is a timing diagram 400 illustrating delayed read access for a read-modify-write operation in a memory component with a delay of two column cycle intervals, according to an embodiment. Timing diagram 400 illustrates a series of memory operations including a read command R0, a first read-modify-write command M1, a second read-modify-write command M2 and a write command W3. These commands may be received over the command bus (CA) 105. Timing diagram 400 illustrates the column cycle intervals 451-461 where the sub-operations of each of these memory operations occur relative to one another, according to one embodiment.

In one embodiment, the first read-modify-write command M1 is received during column cycle interval 451. At column cycle interval 452, the address (A) for the read data is identified 402. Rather than performing the read access (R1) 404 on global data bus (G) 204 during column cycle interval 451, however, the read access (R1) 404 may be delayed by two column cycle intervals. In other embodiments, the delay period may be specified in clock cycles, rather than column cycle intervals, where a column cycle interval may be represented as a some number of clock cycles (e.g., four). In one embodiment, delay element 236 in command interface 130 delays the read address from being provided to memory banks 110 and 120 by an adjustable number of column cycle intervals. The delay may be set by a control signal provided by memory controller 104 to delay element 236, may be specified within the read-modify-write command itself, or can be set by control register values in the memory controller component and memory component. Thus, in one embodiment, the read access (R1) 404 on global data bus (G) 204 may occur during column cycle interval 454. During column cycle interval 453, no sub-operations associated with the first read-modify-write operation may occur, however, a read access on global data bus (G) associated with the read command R0 may occur. In addition, during the column cycle interval 454, the write data W1 408 associated with the read-modify-write command M1 may be received on the data bus (DQ) 107.

During column cycle interval 455, the read data R1 read from memory banks 110 and 120 may be decoded ($D_R$) 406 by decoder 254 in error correction circuit 150. During the same column cycle interval 455, the write data W1 may be merged with the read data R1 using data mask 256 and the merged data may be encoded ($E_W$) 410 by encoder 258 in error correction circuit 150. Thus, the read data is decoded 406 and the merged data is encoded 410 within a same column cycle interval 455 of the system clock. In one embodiment, the period of time that transpires during this merged encoding and decoding is less than a time that transpires when decoding and encoding separately. The individual encode and decode operations may normally each take a time proportional to the logarithm of the number of data bits (e.g., 256). The merged encoding and decoding, however, can be optimized so that it takes essentially the same amount of time, by performing the encode and decode in parallel, and combining them together. During column cycle interval 456, the encoded merged data is written W1 412 to memory banks 110 and 120 at the identified address (A) over global data bus (G) 204. In one embodiment, memory component 102 includes separate address registers for read and write addresses. Thus, in one embodiment, the address (A) where the encoded merged data is written 412 may be retrieved during the same column cycle interval 456 when the address is retrieved for a subsequent read operation.

Once the encoded merged data is written 412 to memory banks 110 and 120, the first read-modify-write operation M1 is complete. In one embodiment, however, during the same column cycle interval 456, the second read-modify-write operation M2 can begin. During column cycle interval 456, the address (A) for the write data R1 and read data R2 is identified 414. The global data bus (G) 204 uses column cycle interval 457 to switch the direction of data flow from writing write data W1 to reading read data R2. In one embodiment, there may be two separate registers in the address pipeline logic that keep these two address values during the overlap portion of the M1 (write) and M2 (read) read-modify-write operations. At column cycle interval 458, the read access (R2) 416 on global data bus (G) 204 may occur. This is after a two column cycle interval delay created by delay element 236 in command interface 130. The remaining sub-operations of the second read-modify-write operation M2 may occur in column cycle intervals 459 and 460 similarly to those described above with respect to the first read-modify-write operation M1.

In this embodiment, the time between the first read-modify-write operation M1 and the second read-modify-write operation M2 is four column cycle intervals (i.e., approximately ¼ or 25% of the peak bandwidth). This represents an improvement of two column cycle intervals over an embodiment where the read access sub-operation 304 is not delayed by at least one column cycle interval. Thus, increasing the delay for the read access sub-operation 404 actually decreases the total amount of time used to perform the read-modify-write operation M1.

Figure 5:
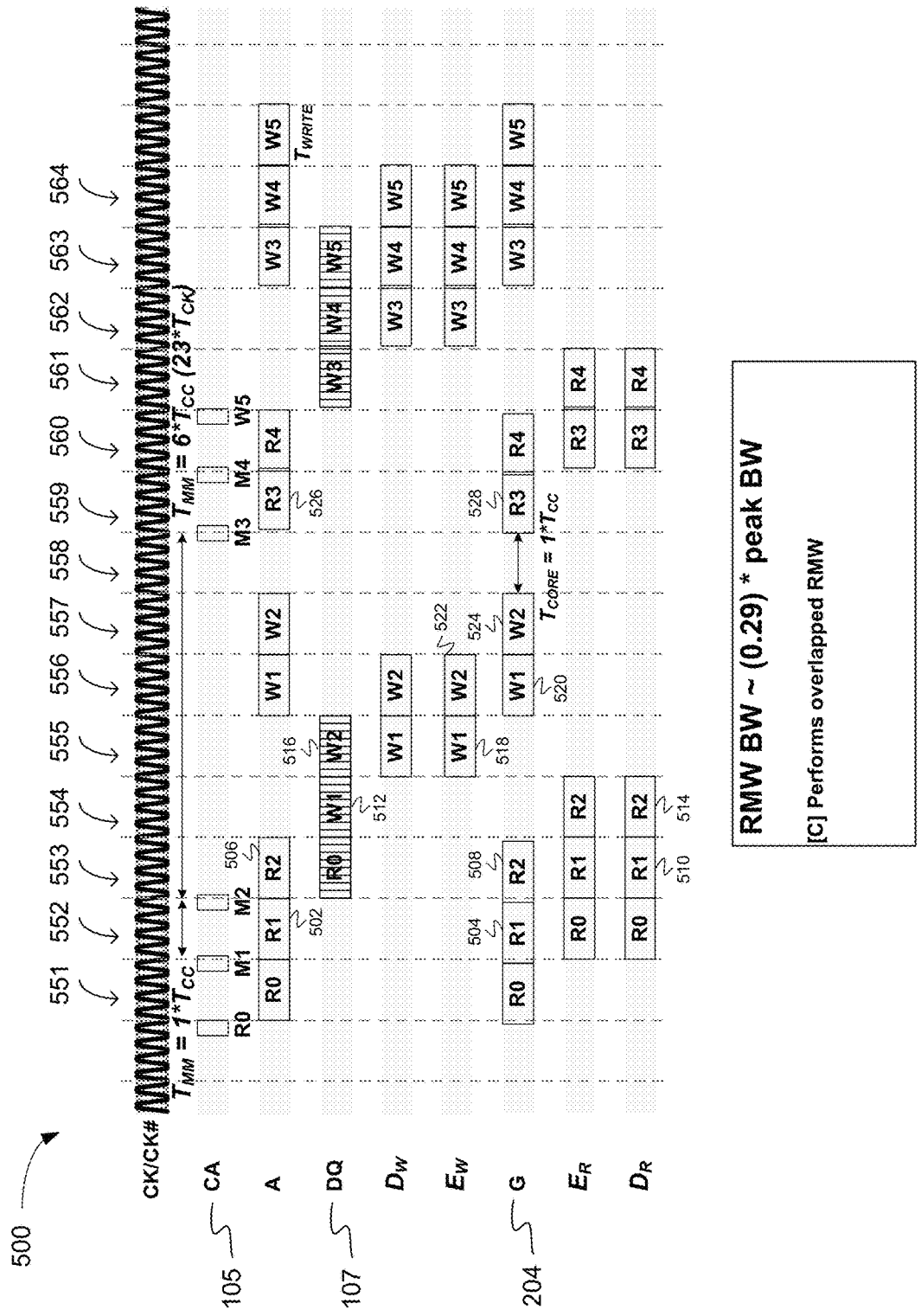
FIG. 5 is a timing diagram illustrating an overlap of two read-modify-write operations in a memory component, according to an embodiment.

FIG. 5 is a timing diagram illustrating an overlap of two read-modify-write operations in a memory component, according to an embodiment. Timing diagram 500 illustrates a series of memory operations including a read command R0, a first read-modify-write command M1, a second read-modify-write command M2, a third read-modify-write command M3, a fourth read-modify-write command M4 and a write command W5. These commands may be received over the command bus (CA) 105. Timing diagram 500 illustrates the column cycle intervals 551-564 where the sub-operations of each of these memory operations occur relative to one another, according to one embodiment.

In one embodiment, the first read-modify-write command M1 is received during column cycle interval 551. At column cycle interval 552, the address (A) for the read data is identified 502. During the same column cycle interval 552, the read access (R1) 504 on global data bus (G) 204 may occur. In this embodiment, there is no delay created by delay element 236 in command interface 130. Also, during column cycle interval 552, the second read-modify-write command M2 is received.

At column cycle interval 553, the address (A) for the read data associated with the second read-modify-write command M2 is identified 506. During the same column cycle interval 553, the read access (R2) 508 for the second read-modify-write command M2 may occur on global data bus (G) 204. Also during column cycle interval 553, the read data R1 associated with the first read-modify-write command M1 read from memory banks 110 and 120 may be decoded ($D_R$) 510 by decoder 254 in error correction circuit 150. Thus, the read access (R2) 508 of the second read-modify-write command M2 occurs before the write access (W1) 520 of the first read-modify-write command M1.

In one embodiment, during the column cycle interval 554, the write data W1 512 associated with the first read-modify-write command M1 may be received on the data bus (DQ) 107. In addition, during column cycle interval 554, the read data R2 associated with the second read-modify-write command M2 read from memory banks 110 and 120 may be decoded ($D_R$) 514 by decoder 254 in error correction circuit 150.

In one embodiment, during the column cycle interval 555, the write data W2 516 associated with the second read-modify-write command M2 may be received on the data bus (DQ) 107. In addition, during column cycle interval 555, the write data W1 may be merged with the read data R1 using data mask 256 and the merged data may be encoded ($E_W$) 518 by encoder 258 in error correction circuit 150.

During column cycle interval 556, the encoded merged data is written W1 520 to memory banks 110 and 120 at the identified address (A) over global data bus (G) 204. In addition, during column cycle interval 556, the write data W2 may be merged with the read data R2 using data mask 256 and the merged data may be encoded ($E_W$) 522 by encoder 258 in error correction circuit 150. At column cycle interval 557, the encoded merged data is written W2 524 to memory banks 110 and 120 at the identified address (A) over global data bus (G) 204.

Once the encoded merged data is written 520 and 524 to memory banks 110 and 120, the first read-modify-write operation M1 and the second read-modify-write operation M2 are complete. In one embodiment, however, during the column cycle interval 558, the third read-modify-write operation M3 can begin. The global data bus (G) 204 uses column cycle interval 558 to switch the direction of data flow from writing write data W2 to reading read data R3. During column cycle interval 559, the address (A) for the read data R3 associated with the third read-modify-write operation M3 is identified 526. At column cycle interval 559, the read access (R3) 528 on global data bus (G) 204 may occur. The remaining sub-operations of the third read-modify-write operation M3 and the fourth read-modify-write operations M4 may occur in column cycle intervals 560-564 similarly to those described above with respect to the first read-modify-write operation M1 and the second read-modify-write operation M2.

In this embodiment, the time between the first read-modify-write operation M1 and the third read-modify-write operation M3 is seven column cycle intervals (i.e., approximately 2/7 or 29% of the peak bandwidth). This represents an improvement of five column cycle intervals over an embodiment where the read-modify-write operations are not overlapped. Thus, starting a second read sub-operation prior to performing the first write sub-operation does not cause problems in the command address pipeline, but instead improves the overall throughput for read-modify-write operations in the memory component.

Figure 6:
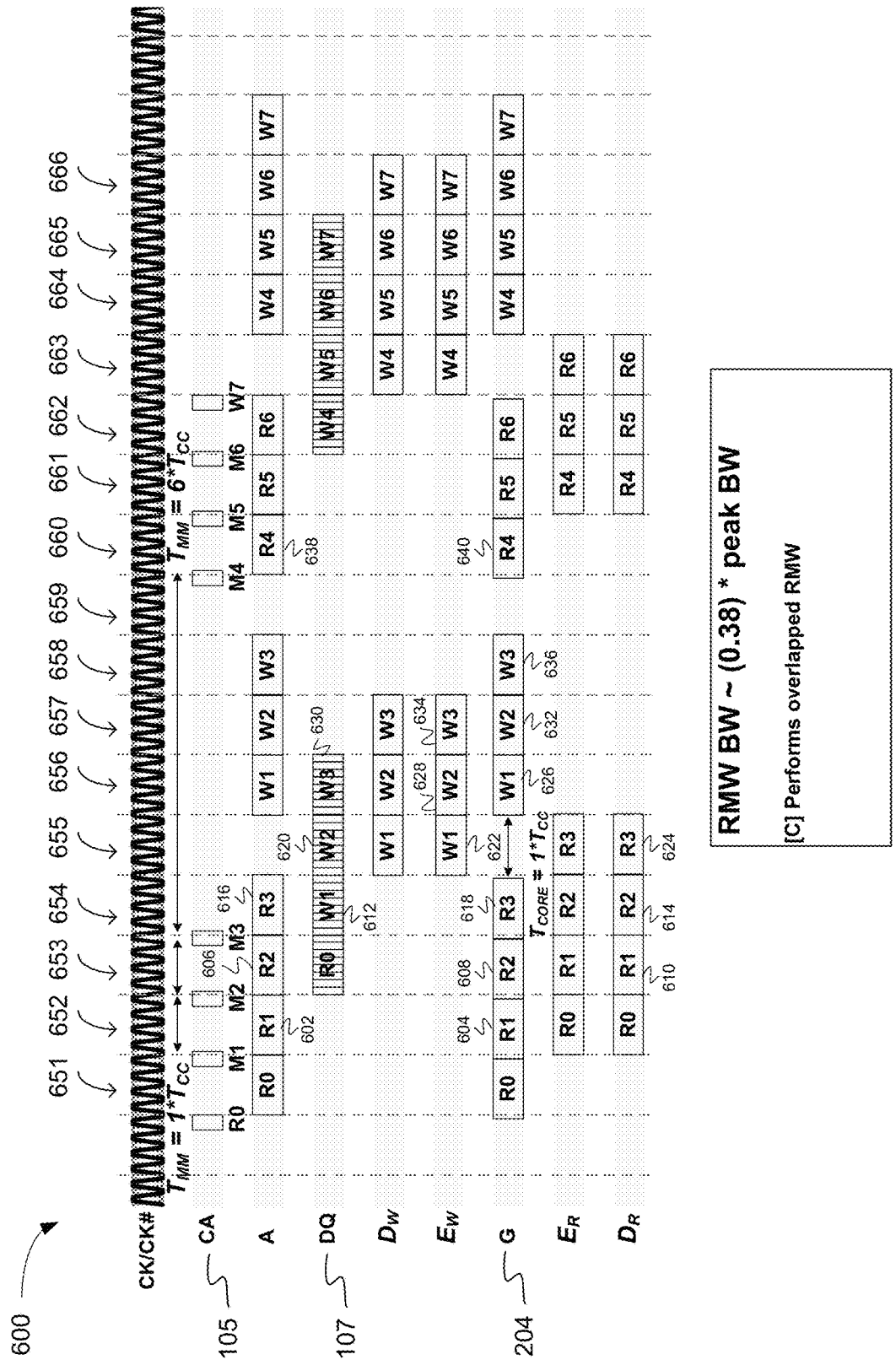
FIG. 6 is a timing diagram illustrating an overlap of three read-modify-write operations in a memory component, according to an embodiment.

FIG. 6 is a timing diagram illustrating an overlap of three read-modify-write operations in a memory component, according to an embodiment. Timing diagram 600 illustrates a series of memory operations including a read command R0, a first read-modify-write command M1, a second read-modify-write command M2, a third read-modify-write command M3, a fourth read-modify-write command M4, a fifth read-modify-write command M5, a sixth read-modify-write command M6, and a write command W7. These commands may be received over the command bus (CA) 105. Timing diagram 600 illustrates the column cycle intervals 651-666 where the sub-operations of each of these memory operations occur relative to one another, according to one embodiment.

In one embodiment, the first read-modify-write command M1 is received during column cycle interval 651. At column cycle interval 652, the address (A) for the read data is identified 602. During the same column cycle interval 652, the read access (R1) 604 on global data bus (G) 204 may occur. In this embodiment, there is no delay created by delay element 236 in command interface 130. Also, during column cycle interval 652, the second read-modify-write command M2 is received.

At column cycle interval 653, the address (A) for the read data associated with the second read-modify-write command M2 is identified 606. During the same column cycle interval 653, the read access (R2) 608 for the second read-modify-write command M2 may occur on global data bus (G) 204. Also during column cycle interval 653, the read data R1 associated with the first read-modify-write command M1 read from memory banks 110 and 120 may be decoded ($D_R$) 610 by decoder 254 in error correction circuit 150. In addition, during column cycle interval 653, the third read-modify-write command M3 is received.

In one embodiment, during the column cycle interval 654, the write data W1 612 associated with the first read-modify-write command M1 may be received on the data bus (DQ) 107. During the same column cycle interval 654, the read data R2 associated with the second read-modify-write command M2 read from memory banks 110 and 120 may be decoded ($D_R$) 614 by decoder 254 in error correction circuit 150. Also during column cycle interval 654 the address (A) for the read data associated with the third read-modify-write command M3 is identified 616. In addition, during column cycle interval 654, the read access (R3) 618 for the third read-modify-write command M3 may occur on global data bus (G) 204. Thus, the read access (R3) 618 of the third read-modify-write command M3 occurs before the write access (W1) 626 of the first read-modify-write command M1.

In one embodiment, during the column cycle interval 655, the write data W2 620 associated with the second read-modify-write command M2 may be received on the data bus (DQ) 107. In addition, during column cycle interval 655, the write data W1 may be merged with the read data R1 using data mask 256 and the merged data may be encoded ($E_W$) 622 by encoder 258 in error correction circuit 150. Also during column cycle interval 654, the read data R3 associated with the third read-modify-write command M3 read from memory banks 110 and 120 may be decoded ($D_R$) 624 by decoder 254 in error correction circuit 150. Furthermore, the global data bus (G) 204 uses column cycle interval 655 to switch the direction of data flow from reading read data R3 to writing write data W3.

During column cycle interval 656, the encoded merged data is written W1 626 to memory banks 110 and 120 at the identified address (A) over global data bus (G) 204. In addition, during column cycle interval 656, the write data W2 may be merged with the read data R2 using data mask 256 and the merged data may be encoded ($E_W$) 628 by encoder 258 in error correction circuit 150. Also, during the column cycle interval 656, the write data W3 630 associated with the third read-modify-write command M3 may be received on the data bus (DQ) 107.

At column cycle interval 657, the encoded merged data is written W2 632 to memory banks 110 and 120 at the identified address (A) over global data bus (G) 204. Also at column cycle interval 657, the write data W3 may be merged with the read data R3 using data mask 256 and the merged data may be encoded ($E_W$) 634 by encoder 258 in error correction circuit 150. At column cycle interval 658, the encoded merged data is written W3 636 to memory banks 110 and 120 at the identified address (A) over global data bus (G) 204.

Once the encoded merged data is written 626, 632 and 636 to memory banks 110 and 120, the first read-modify-write operation M1, the second read-modify-write operation M2 and the third read-modify-write operation M3 are complete. In one embodiment, however, during the column cycle interval 659, the fourth read-modify-write operation M4 can begin. The global data bus (G) 204 uses column cycle interval 659 to switch the direction of data flow from writing write data W3 to reading read data R4. During column cycle interval 660, the address (A) for the read data R4 associated with the fourth read-modify-write operation M4 is identified 638. At column cycle interval 660, the read access (R4) 640 on global data bus (G) 204 may occur. The remaining sub-operations of the fourth read-modify-write operation M4, the fifth read-modify-write operations M5 and the sixth read-modify-write operation M6 may occur in column cycle intervals 661-666 similarly to those described above with respect to the first read-modify-write operation M1, the second read-modify-write operation M2 and the third read-modify-write operation M3.

In this embodiment, the time between the first read-modify-write operation M1 and the fourth read-modify-write operation M4 is eight column cycle intervals (i.e., approximately ⅜ or 38% of the peak bandwidth). This represents an improvement of thirteen column cycle intervals over an embodiment where the read-modify-write operations are not overlapped.

Figure 7:
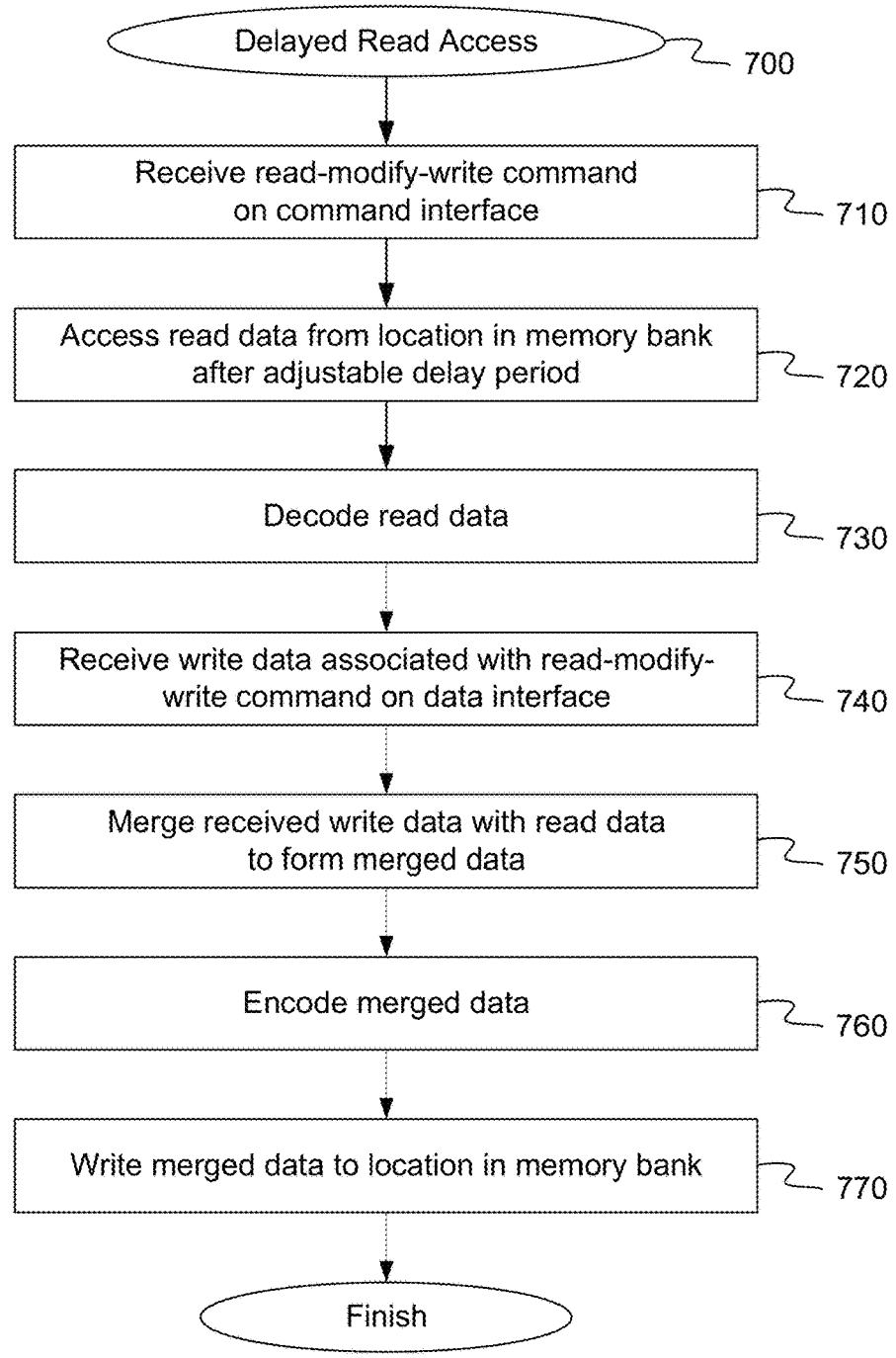
FIG. 7 is a flow diagram illustrating delayed read access for a read-modify-write operation in a memory component, according to an embodiment.

FIG. 7 is a flow diagram illustrating delayed read access for a read-modify-write operation in a memory component, according to an embodiment. The method 700 may be performed by processing logic that comprises hardware (e.g., circuitry, dedicated logic, programmable logic, microcode, etc.), software (e.g., instructions run on a processing device to perform hardware simulation), or a combination thereof. The method 700 can perform a read-modify-write operation by delaying the read access sub-operation of the read-modify-write operation by a programmable length of time. For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one embodiment, method 700 may be performed by memory component 102, as shown in FIGS. 1 and 2.

Referring to FIG. 7, at block 710, according to method 700, a read-modify-write command is received on a command interface 130. The read-modify-write command may be received at command address (CA) pads 232, the read-modify write command being sent by memory controller 104, or some other component, over command bus 105. In one embodiment, the read-modify-write command includes a 16 bit value. In other embodiments, however, the read-modify-write command may include a value of some other size.

At block 720, method 700 includes accessing read data associated with the read-modify-write command from a location in a memory bank after an adjustable delay period has transpired. In one embodiment, a delay element 236 in command interface 130 delays the read address from being provided to memory banks 110 and 120 by an adjustable number of column cycle intervals. The delay may be set by a control signal provided by memory controller 104 to delay element 236 or may be specified within the read-modify-write command itself. In other embodiments the delay may be controlled by some other component. In one embodiment, after the delay (e.g., a set number of column cycle intervals or system clock cycles) the address A indicating a location in memory banks 110 and 120 is driven out on global address bus 202 to memory banks 110 and 120. A data access operation at the location specified by the address A is performed and a 266 bit data value is driven onto global data bus 204 from the memory banks 110 and 120. This value may be stored in register 252 of error correction circuit 150. In one embodiment, this value may be referred to as the "read data" associated with the read-modify-write operation.

At block 730, method 700 includes decoding the read data. In one embodiment, a decoder 254 decodes the 266 bit read data. The decoder 254 performs error detection and correction on the read data using a 10 bit syndrome in the read data. Depending on the embodiment, decoder 254 may use hamming error correction, single error correction/double error detection, or some other error correction technique to correct at least single bit errors in the read data. As a result of the error correction, the 10 bit syndrome is removed and decoder 254 outputs a 256 bit value.

At block 740, method 700 includes receiving write data associated with the read-modify-write command on a data interface 140. The write data may be received at DQ pads 242 in data interface 140 from memory controller 104 over data bus 107. In one embodiment, the write data includes eight 32 bit words that are deserialized by deserializer 244 into a 256 bit value. In other embodiments, however, the write data may include a value or values of some other size. Based on the clock signal (CK) the 256 bit value may be stored in a register 246.

At block 750, method 700 includes merging the received write data with the read data to form a merged data. In one embodiment, the deserialized write data from register 246 is merged with the error corrected read data from decoder 254 using a data mask 256. In one embodiment, the data mask 256 is received with the write data from memory controller 104. The data mask 256 may include data used for bitwise operations to signify which bits from the write data should be overwritten with bits from the read data and which bits in the write data should remain unchanged. The result of data mask 256 is a 256 bit merged data value.

At block 760, method 700 includes encoding the merged data. In one embodiment, encoder 258 encodes the merged data by generating a ten bit syndrome and adding (e.g., appending) the syndrome to the merged data to create a 256 bit value.

At block 770, method 700 includes writing the encoded merged data to the location in the memory bank from which the read data was read. Error correction circuit 150 may drive the 256 bit value onto global data bus 204, where the value is written to memory banks 110 and 120 at the location identified by address A (i.e., the location from which the read data was read).

Figure 8:
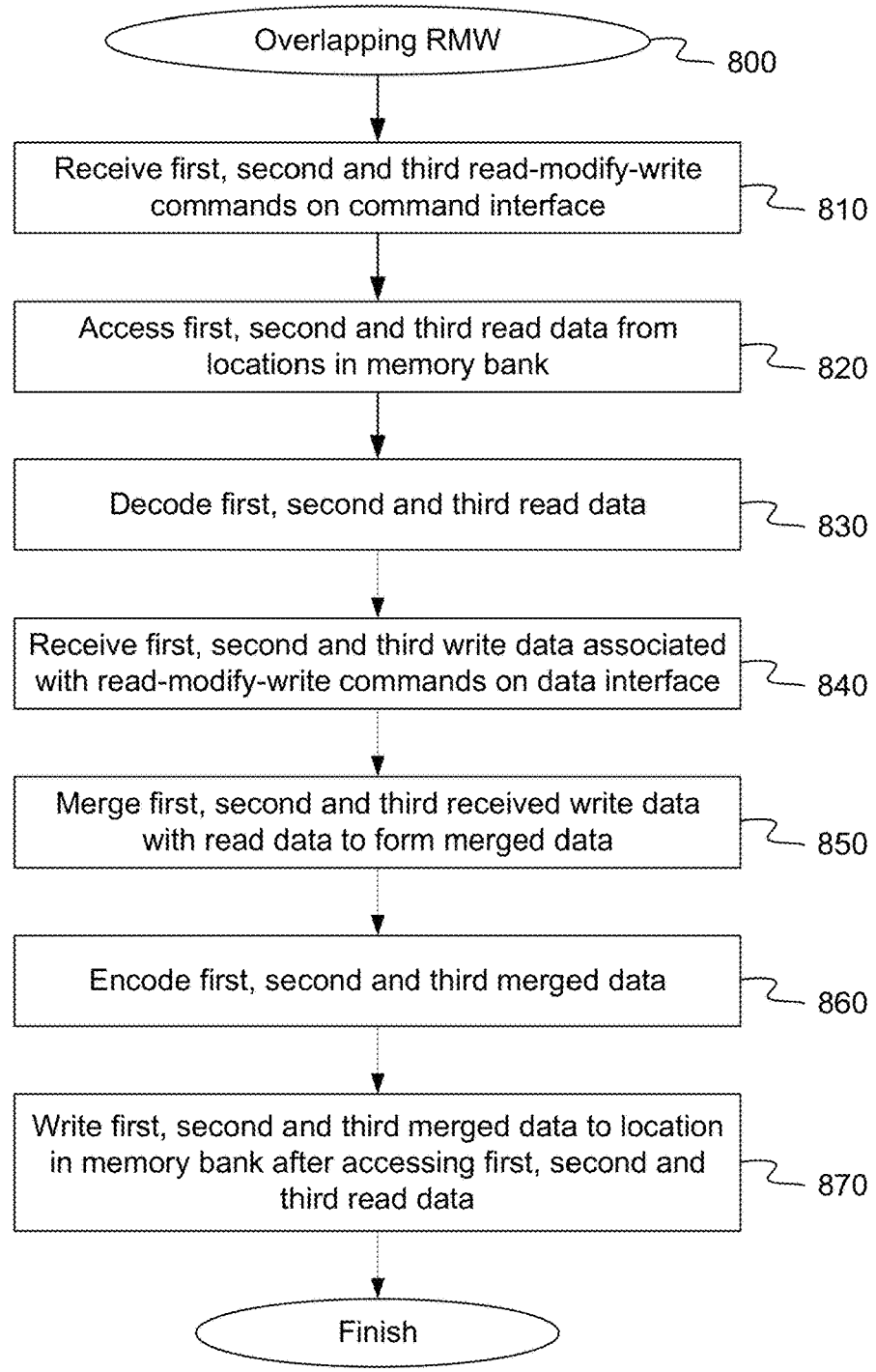
FIG. 8 is a flow diagram illustrating overlapping read-modify-write operations in a memory component, according to an embodiment.

FIG. 8 is a flow diagram illustrating overlapping read-modify-write operations in a memory component, according to an embodiment. The method 800 may be performed by processing logic that comprises hardware (e.g., circuitry, dedicated logic, programmable logic, microcode, etc.), software (e.g., instructions run on a processing device to perform hardware simulation), or a combination thereof. The method 800 can perform a read-modify-write operation by overlapping multiple read-modify-write operations. In one embodiment, method 800 may be performed by memory component 102, as shown in FIGS. 1 and 2.

Referring to FIG. 8, at block 810, according to method 800 first, second and third read-modify-write commands are received on a command interface 130. The read-modify-write commands may be received at command address (CA) pads 232 from memory controller 104, or some other component, over command bus 105. In one embodiment, the read-modify-write commands are received in successive column cycle intervals or are spaced in time by some number of system clock cycles. In other embodiments, some other number of read-modify-write commands may be received in a burst (e.g., two, four, five, etc.)

At block 820, method 800 includes accessing read data associated with the read-modify-write commands from specified locations in a memory bank. In one embodiment, there is no delay prior to the read access sub-operation, and the read access may occur during the same or the next column cycle interval as when then read-modify-write operation was received. In one embodiment, the address A indicating a location in memory banks 110 and 120 is driven out on global address bus 202 to memory banks 110 and 120. A data access operation at the location specified by the address A is performed and a 266 bit data value is driven onto global data bus 204 from the memory banks 110 and 120. In one embodiment, the data access operations for each of the received read-modify-write operations are performed in successive column cycle intervals or are spaced in time by some number of system clock cycles. In one embodiment, the data access operation for each read-modify-write operation in the burst is performed before the data write sub-operations of any of the read-modify-write operations in the burst.

At block 830, method 800 includes decoding the read data corresponding to each read-modify-write operation. In one embodiment, a decoder 254 decodes the 266 bit read data. The decoder 254 performs error detection and correction on the read data using a 10 bit syndrome in the read data. Depending on the embodiment, decoder 254 may use hamming error correction, single error correction/double error detection, or some other error correction technique to correct at least single bit errors in the read data. As a result of the error correction, the 10 bit syndrome is removed and decoder 254 outputs a 256 bit value for each operation.

At block 840, method 800 includes receiving write data associated with the read-modify-write commands on a data interface 140. The write data may be received at DQ pads 242 in data interface 140 from memory controller 104 over data bus 107. In one embodiment, the write data includes eight 32 bit words that are deserialized by deserializer 244 into a 256 bit value. In other embodiments, however, the write data may include a value or values of some other size. In one embodiment, the write data for each command is received in successive column cycle intervals or is spaced in time by some number of system clock cycles.

At block 850, method 800 includes merging the received write data with the read data to form a merged data for each operation. In one embodiment, the deserialized write data from register 246 is merged with the error corrected read data from decoder 254 using a data mask 256. In one embodiment, the data mask 256 is received with the write data from memory controller 104. The data mask 256 may include data used for bitwise operations to signify which bits from the write data should be overwritten with bits from the read data and which bits in the write data should remain unchanged. The result of data mask 256 is a 256 bit merged data value.

At block 860, method 800 includes encoding the merged data. In one embodiment, encoder 258 encodes the merged data by generating a ten bit syndrome and adding (e.g., appending) the syndrome to the merged data to create a 256 bit value for each read-modify-write operation.

At block 870, method 800 includes writing the encoded merged data to the location in the memory bank from which the read data was read. Error correction circuit 150 may drive the 256 bit value onto global data bus 204, where the value is written to memory banks 110 and 120 at the location identified by address A (i.e., the location from which the read data was read). In one embodiment, the write sub-operation for each read-modify-write operation in the burst is performed only after the read operations for all of the read-modify-write operations in the burst have been completed.

Figure 9:
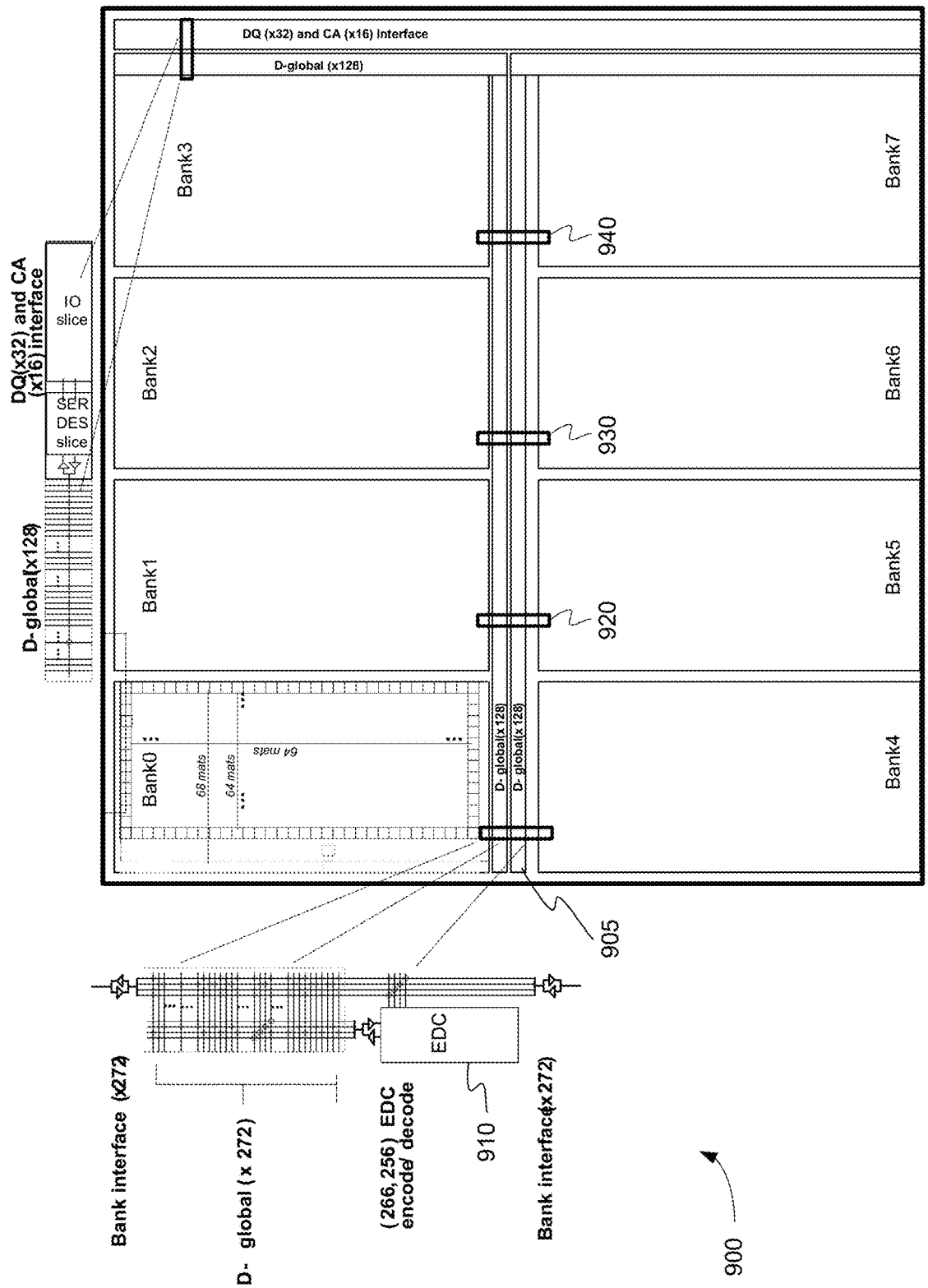
FIG. 9 is a block diagram illustrating a memory component with a dedicated error detection and correction circuit for each pair of memory banks, according to an embodiment.

FIG. 9 is a block diagram illustrating a memory component 900 with a dedicated error detection and correction circuit for each pair of memory banks, according to an embodiment. In one embodiment, memory component 900 may be similar to memory component 102, as discussed above with respect to FIGS. 1 and 2. In one embodiment, memory component 900 includes a number of memory banks, which may be similar to memory banks 110 and 120 discussed above. The memory banks in memory components may be arrange in pairs, where the memory banks in each pair are associated with one another. For example, the memory bank pairs may include Bank0 and Bank4, Bank1 and Bank5, Bank2 and Bank6, and Bank3 and Bank7. Each of the memory banks may be connected by global data bus 905.

In one embodiment, each memory bank pair shares a dedicated error detection and correction circuit 910, 920, 930, and 940. In one embodiment, the error detection and correction units may be located beneath or adjacent to the global data bus 905. For example, as shown in the expanded view of error detection and correction circuit 910, there may be a shared 4-bit wire that connects from the bank pair (i.e. Bank0 and Bank4) to the error detection and correction circuit 910, and a second 4-bit wire that connects from the error detection and correction circuit 910 to the 272 bit global bus 905 that couples to the interfaces (e.g., data interface 140 and command interface 130). Each of error detection and correction circuits 910, 920, 930 and 940 may be similar to the error correction circuit 150 described above with respect to FIGS. 1 and 2.

In one embodiment, the dedicated error detection and correction circuits 910, 920, 930 and 940 for each memory bank pair allows the error detection and correction for a read-modify-write operation for one bank of a pair to proceed in parallel with the other bank of the bank pair in a staggered fashion. The cost of this approach is that additional error detection and correction circuits used. In one embodiment, however, the footprint can be reduced if the error detection and correction circuits 910, 920, 930 and 940 are built under the 256-bit global bus 905.

In one embodiment, memory controller 104 is aware of the restriction that only one bank of each memory bank pair can perform a read-modify-write operation at a time. With careful optimization and re-ordering of the write transactions, however, the bandwidth for these read-modify-write operations can approximately match that of a stream of normal write operations.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

Reference throughout this specification to "one embodiment" or "an embodiment" means that a particular feature, structure, or characteristic described in connection with the embodiments included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method of operation in a memory component, the method comprising:
   receiving a first memory command having an associated first read address indicating a first location in a memory bank of the memory component;
   receiving, after receiving the first memory command, a second memory command having an associated second read address indicating a second location in the memory bank of the memory component;
   performing first memory operations associated with the first and second memory commands on data at the first and second locations in the memory bank;
   modifying the data from the first and second locations in the memory bank to produce first and second modified data; and
   performing, after the first memory operations, second memory operations associated with the first and second memory commands using the first and second modified data.

2. The method of claim 1, wherein performing the first memory operations associated with the first and second memory commands comprises:
   accessing first read data from the first location in the memory bank and second read data from the second location in the memory bank; and
   receiving first write data associated with the first memory command and second write data associated with the second memory command.

3. The method of claim 2, wherein modifying the data from the first and second locations in the memory bank comprises:
   merging the first received write data with the first read data to form the first modified data;
   merging the second received write data with the second read data to form the second modified data.

4. The method of claim 3, wherein performing the second memory operations associated with the first and second memory commands comprises:
   writing the first modified data to the first location in the memory bank; and
   writing, after accessing the second read data from the second location in the memory bank, the second modified data to the second location in the memory bank.

5. The method of claim 1, further comprising:
   decoding the data at the first and second locations in the memory bank prior to modifying the data to produce the first and second modified data, wherein decoding the data comprises correcting single bit errors in the data using an error syndrome in the data.

6. The method of claim 1, wherein modifying the data from the first and second locations in the memory bank comprises combining the data using a data mask.

7. The method of claim 1, further comprising:
   encoding the first and second modified data prior to performing the second memory operations, wherein encoding the first and second modified data comprises generating an error syndrome for the first and second modified data.

8. A memory component comprising:
   a memory bank;
   processing logic coupled to the memory bank, wherein the processing logic is configured to:
      receive a first memory command having an associated first read address indicating a first location in a memory bank of the memory component;
      receive, after receiving the first memory command, a second memory command having an associated second read address indicating a second location in the memory bank of the memory component;
      perform first memory operations associated with the first and second memory commands on data at the first and second locations in the memory bank;
      modify the data from the first and second locations in the memory bank to produce first and second modified data; and
      perform, after the first memory operations, second memory operations associated with the first and second memory commands using the first and second modified data.

9. The memory component of claim 8, wherein to perform the first memory operations associated with the first and second memory commands, the processing logic is configured to:
   access first read data from the first location in the memory bank and second read data from the second location in the memory bank; and
   receive first write data associated with the first memory command and second write data associated with the second memory command.

10. The memory component of claim 9, wherein to modify the data from the first and second locations in the memory bank, the processing logic is configured to:
   merge the first received write data with the first read data to form the first modified data;
   merge the second received write data with the second read data to form the second modified data.

11. The memory component of claim 10, wherein to perform the second memory operations associated with the first and second memory commands, the processing logic is configured to:
write the first modified data to the first location in the memory bank; and
write, after accessing the second read data from the second location in the memory bank, the second modified data to the second location in the memory bank.

12. The memory component of claim 8, wherein the processing logic is further configured to:
decode the data at the first and second locations in the memory bank prior to modifying the data to produce the first and second modified data, wherein decoding the data comprises correcting single bit errors in the data using an error syndrome in the data.

13. The memory component of claim 8, wherein to modify the data from the first and second locations in the memory bank, the processing logic is configured to combine the data using a data mask.

14. The memory component of claim 8, wherein the processing logic is further configured to:
encode the first and second modified data prior to performing the second memory operations, wherein encoding the first and second modified data comprises generating an error syndrome for the first and second modified data.

15. A memory component comprising:
a memory bank;
a command interface coupled to the memory bank, the command interface to receive a first memory command having an associated first read address indicating a first location in the memory bank, and to receive, after receiving the first memory command, a second memory command having an associated second read address indicating a second location in the memory bank;
a data interface coupled to the memory bank, the data interface to perform first memory operations associated with the first and second memory commands on data at the first and second locations in the memory bank; and
an error correction circuit coupled to the data interface and to the memory bank, the error correction circuit to modify the data from the first and second locations in the memory bank to produce first and second modified data, and to perform, after the first memory operations, second memory operations associated with the first and second memory commands using the first and second modified data.

16. The memory component of claim 15, wherein to perform the first memory operations associated with the first and second memory commands, the data interface is to:
access first read data from the first location in the memory bank and second read data from the second location in the memory bank; and
receive first write data associated with the first memory command and second write data associated with the second memory command.

17. The memory component of claim 16, wherein to modify the data from the first and second locations in the memory bank, the error correction circuit is to:
merge the first received write data with the first read data to form the first modified data; and
merge the second received write data with the second read data to form the second modified data.

18. The memory component of claim 17, wherein to perform the second memory operations associated with the first and second memory commands, the error correction circuit is to:
write the first modified data to the first location in the memory bank; and
write, after accessing the second read data from the second location in the memory bank, the second modified data to the second location in the memory bank.

19. The memory component of claim 15, wherein the data interface is further to:
decode the data at the first and second locations in the memory bank prior to modifying the data to produce the first and second modified data, wherein to decode the data, the data interface is to correct single bit errors in the data using an error syndrome in the data.

20. The memory component of claim 15, wherein to modify the data from the first and second locations in the memory bank, the error correction circuit is to combine the data using a data mask.

* * * * *